(12) United States Patent
Brady et al.

(10) Patent No.: US 6,215,401 B1
(45) Date of Patent: Apr. 10, 2001

(54) NON-LAMINATED COATING FOR RADIO FREQUENCY TRANSPONDER (RF TAG)

(75) Inventors: Michael J. Brady, Brewster; Paul A. Moskowitz, Yorktown Heights, both of NY (US)

(73) Assignee: Intermec IP Corp.

(*) Notice: Subject to any disclaimer, the term of this patent is extended or adjusted under 35 U.S.C. 154(b) by 0 days.

(21) Appl. No.: 09/267,766

(22) Filed: Mar. 13, 1999

Related U.S. Application Data

(63) Continuation-in-part of application No. 09/169,416, filed on Oct. 9, 1998, which is a continuation of application No. 08/621,385, filed on Mar. 25, 1996, now Pat. No. 5,826,328.
(60) Provisional application No. 60/077,873, filed on Mar. 13, 1998.

(51) Int. Cl.[7] .................................................. G08B 13/14
(52) U.S. Cl. ..................................... 340/572.7; 340/572.1; 340/568.1
(58) Field of Search .............................. 340/572.1, 572.4, 340/572.7, 572.8, 568.1, 568.7; 422/68.1, 55, 57, 58; 427/96, 386, 558, 559; 257/723, 724

(56) References Cited

U.S. PATENT DOCUMENTS

| | | | |
|---|---|---|---|
| 5,091,447 | * 2/1992 | Lomasney | 523/408 |
| 5,242,715 | * 9/1993 | Schoen et al. | 427/386 |
| 5,406,263 | * 4/1995 | Tuttle | 340/572.1 |
| 5,448,110 | * 9/1995 | Tuttle et al. | 257/723 |
| 5,487,926 | * 1/1996 | Kuribayashi et al. | 428/33 |
| 5,682,143 | * 10/1997 | Brady et al. | 340/572.7 |
| 5,961,923 | * 10/1999 | Nova et al. | 422/68.1 |

* cited by examiner

*Primary Examiner*—Van T. Trieu
(74) *Attorney, Agent, or Firm*—R. T. Hodgson

(57) ABSTRACT

The present invention is an RF tag having a non laminated coating for protecting the semiconductor chip, antenna, and chip antenna connections, and methods for applying the non-laminated coating.

13 Claims, 1 Drawing Sheet

NON-LAMINATED COATING FOR RADIO FREQUENCY TRANSPONDER (RF TAG)

This application is a continuation-in-part of U.S. application Ser. No. 09/169,416, filed Oct. 9, 1998 by Brady et. al, entitled Method of making a thin radio frequency transponder, which is a continuation of application Ser. No. 08/621,385, (now U.S. Pat. No. 5,826,328 issued Oct. 27, 1998 which was filed Mar. 25, 1996, which two applications are incorporated herein in their entirety.

This application claims priority benefit from U.S. Provisional application 60/077,873 which was filed Mar. 13, 1998, and which is incorporated herein in its entirety.

FIELD OF THE INVENTION

The field of the invention is the field of Radio Frequency (RF) transponders (RF Tags) which receive RF electromagnetic radiation from a base station and send information to the base station by modulating the load of an RF antenna.

BACKGROUND OF THE INVENTION

RF Tags can be used in a multiplicity of ways for locating and identifying accompanying objects, items, animals, and people, whether these objects, items, animals, and people are stationary or mobile, and transmitting information about the state of the of the objects, items, animals, and people. It has been known since the early 60's in U.S. Pat. No. 3,098,971 by R. M. Richardson, that electronic components on a transponder could be powered by radio frequency (RF) power sent by a "base station" at a carrier frequency and received by an antenna on the tag. The signal picked up by the tag antenna induces an alternating current in the antenna which can be rectified by an RF diode and the rectified current can be used for a power supply for the electronic components. The tag antenna loading is changed by something that was to be measured, for example a microphone resistance in the cited patent. The oscillating current induced in the tag antenna from the incoming RF energy would thus be changed, and the change in the oscillating current led to a change in the RF power radiated from the tag antenna. This change in the radiated power from the tag antenna could be picked up by the base station antenna and thus the microphone would in effect broadcast power without itself having a self contained power supply. In the cited patent, the antenna current also oscillates at a harmonic of the carrier frequency because the diode current contains a doubled frequency component, and this frequency can be picked up and sorted out from the carrier frequency much more easily than if it were merely reflected. Since this type of tag carries no power supply of its own, it is called a "passive" tag to distinguish it from an active tag containing a battery. The battery supplies energy to run the active tag electronics, but not to broadcast the information from the tag antenna. An active tag also changes the loading on the tag antenna for the purpose of transmitting information to the base station.

The "rebroadcast" or "reflection" of the incoming RF energy at the carrier frequency is conventionally called "back scattering", even though the tag broadcasts the energy in a pattern determined solely by the tag antenna and most of the energy may not be directed "back" to the transmitting antenna.

In the 70's, suggestions to use tags with logic and read/write memories were made. In this way, the tag could not only be used to measure some characteristic, for example the temperature of an animal in U.S. Pat. No. 4,075,632 to Baldwin et. al., but could also identify the animal. The antenna load was changed by use of a transistor. A transistor switch also changed the loading of the transponder in U.S. Pat. No. 4,786,907 by A. Koelle.

Prior art tags have used electronic logic and memory circuits and receiver circuits and modulator circuits for receiving information from the base station and for sending information from the tag to the base station.

The continuing march of semiconductor technology to smaller, faster, and less power hungry has allowed enormous increases of function and enormous drop of cost of such tags. Presently available research and development technology will also allow new function and different products in communications technology.

Prior art tags have generally been made from discrete components mounted on printed circuit boards. The antennas have been formed by etching material from the copper of the printed circuit board. Some prior art tags have been formed from mounting the silicon chips and bonded antennas on flexible plastic substrates. The components, antenna wire, and connections must be protected from the environment in all cases. Some prior art tags mounted on flexible substrates are protected by laminating a cover on to the flexible substrate to make a hermetic seal. Such sealing methods are unsatisfactory, as the seal may be broken if the tag is bent or abraded in use. In addition, the extra material for the lamination is expensive.

RELATED PATENTS AND APPLICATIONS

Related U.S. Pat. Nos. assigned to the assignee of the present invention include:5,521,601; 5,528,222; 5,538,803; 5,550.547; 5,552,778; 5,554,974; 5,563,583; 5,565,847; 5,606,323; 5,635,693; 5,673,037; 5,680,106;5,682,143; 5,729,201; 5,729,697;5,736,929; 5,739,754; 5,767,789; 5,777,561; 5,786,626; 5,812,065; 5,821,859; and 5,826,328. U.S. patent applications assigned to the assignee of the present invention include: application No. 08/626,820, filed: Apr. 3, 1996, entitled "Method of Transporting RF Power to Energize Radio Frequency Transponders", by Heinrich, Zai, et al.; application Ser. No. 08/694,606 filed Aug. 9, 1996 entitled RFID System with Write Broadcast Capability by Cesar et al. ; application Ser. No. 08/681,741 filed Jul. 29, 1996 entitled RFID Transponder with Electronic Circuitry Enabling and Disabling Capability, by Heinrich, Goldman et al.; and application Ser. No. 09/153,617 1 filed Sep. 25, 1998, entitled RFID Interrogator Signal Processing System for Reading Moving Transponder, by Zai et al. The above identified U.S. Patents and U.S. Patent applications are hereby incorporated by reference.

OBJECTS OF THE INVENTION

It is an object of the invention to produce an RE transponder which can be made at low cost. It is a further object of the invention to produce an RF transponder which can be used at high frequencies. It is a further object of the invention to provide an RF transponder having a protective coating which protects the transponder from the deleterious effects due to bending and abrading.

SUMMARY OF THE INVENTION

The present invention is an RF tag having a non laminated coating for protecting the semiconductor chip, antenna, and chip antenna connections, and a method for applying the non-laminated coating.

DETAILED DESCRIPTION OF THE INVENTION

Figure 1:
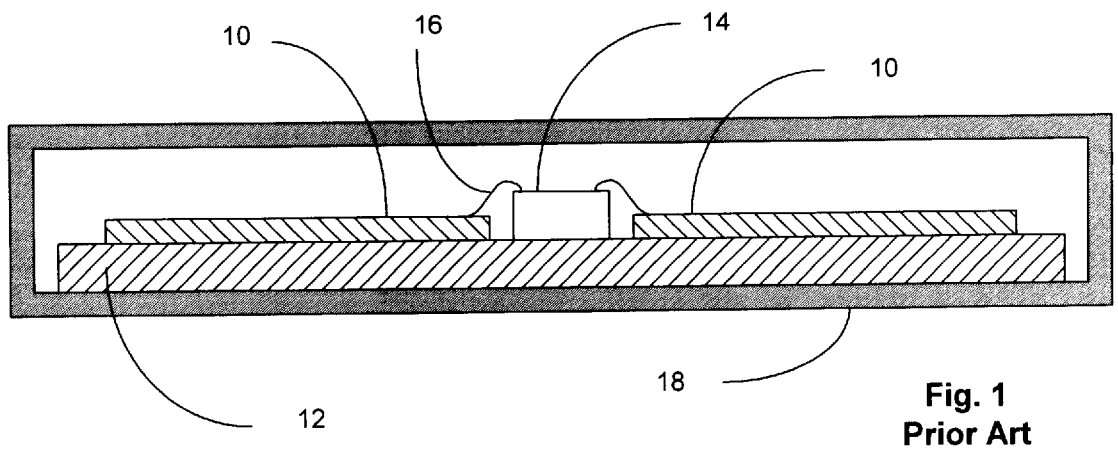
FIG. 1. is a sketch of a prior art tag.

FIG. 1 shows a sketch of a prior art tag where a tag antenna 10 is formed on a printed circuit board 12. A semiconductor device 14 is joined to the antenna by means 16 well known in the art, such as wire bonding, TAB bonding, soldering, or other means. The entire tag may be encased in a plastic case 18 which is hermetically sealed by ultrasonic welding, or has sealing elements (not shown).

Figure 2:
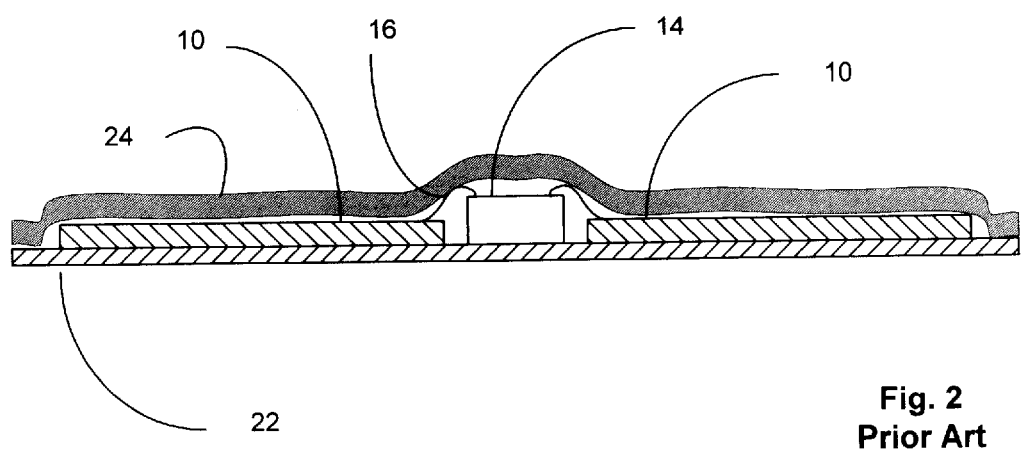
FIG. 2. is a sketch of a prior art tag.

FIG. 2 shows a sketch of a prior art tag having a tag antenna formed on a flexible substrate 22 which may be made of polyimide or other suitable material such as paper, polymer etc. The tag may be hermetically sealed by laminating a material 24 to the flexible substrate 22. Such a tag is described in great detail in U.S. Pat. Nos. 5,528,222 and 5,682,143.

Figure 3:
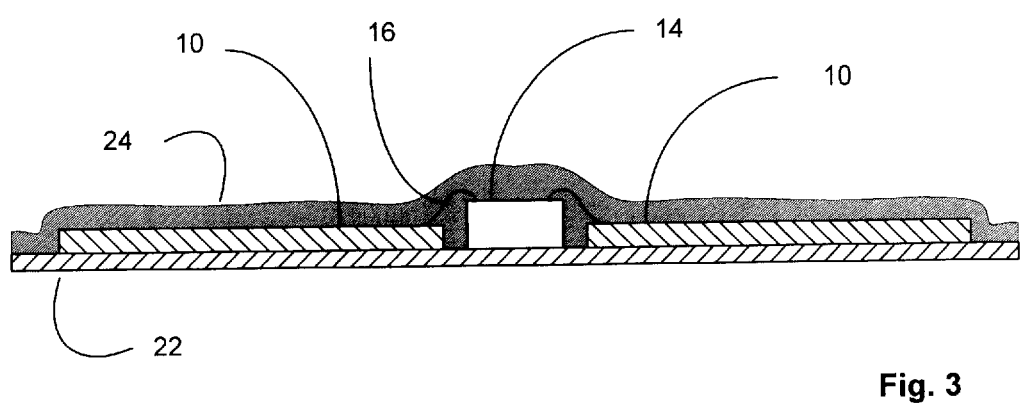
FIG. 3. is a sketch of a preferred embodiment of the invention.

FIG. 3 shows one embodiment of the apparatus of the invention. The antenna 10 and the semiconductor device 14 may be formed on a flexible circuit as shown in FIG. 3, or on a printed circuit board, but the protection from the ambient moisture comes from a conformable coating 34 applied over the entire antenna 10, device 14, and substrate 22. The conformable coating 34 may be any suitable material which is sufficiently impermeable to water and/or other environmental constituents which would cause the antenna 10, the device 14, or the connections between them to degrade over time. Suitable coatings which have been tried and which are successful in protecting the tag are poly vinyl butyral, nitro-cellulose, a uv cured epoxy UV-7900 from Emerson and Cummings, Humiseal$^R$, and parylene. These coatings may be applied by dipping, spraying, or vacuum deposition. The coatings may be cured by applying heat, radiation such as ultraviolet light radiation, electron beam irradiation, or other radiation, or chemical reaction. The most preferred embodiment is to use vacuum deposited parylene material.

Figure 4:
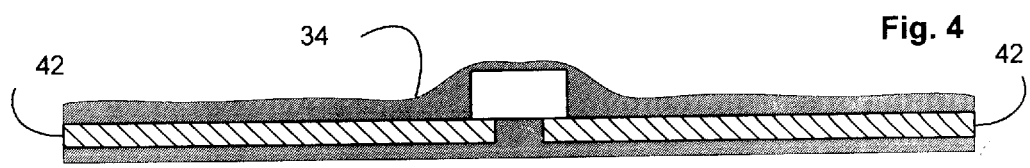
FIG. 4. is a sketch of a preferred embodiment of the invention.

FIG. 4 shows an additional embodiment of the invention where the RF tag is formed from a semiconductor device 14 attached to an antenna 10 with no supporting substrate. A series of devices 14 may be electrically bonded to wires and strung like beads on a string. Each tag may be cut out and the device 14 and the antennas 10 may be coated with a conformable coating 34 as noted above, or the entire string may be coated with a conformable coating and at a later time each individual tag may be cut from the string to give a tag as sketched in FIG. 4. In this case, the conformable coating will not protect the ends 42 of the antennas 10, but the environmental constituents are still kept well away from the sensitive semiconductor device 14 and the connection between the antenna 10 and the device 14.

Obviously, many modifications and variations of the present invention are possible in light of the above teachings. It is therefore to be understood that, within the scope of the appended claims, the invention may be practiced otherwise then as specifically described.

We claim:

1. A radio frequency transponder (RF tag), comprising:
    an antenna for communicating RF signals between the RF tag and a base station;
    at least one semiconductor device connected to the antenna; and
    a non-laminated coating protecting th& antenna and the semiconductor device.

2. The RF tag of claim 1, wherein the antenna and the device are mounted on a printed circuit board.

3. The RF tag of claim 1, wherein the antenna and the device are mounted on a flexible substrate.

4. The RF tag of claim 1, wherein the antenna and the device are not mounted on a substrate.

5. The RF tag of claim 1, wherein the non laminated coating is formed by dipping.

6. The RF tag of claim 1, wherein the non laminated coating is formed by spraying.

7. The RF tag of claim 1, wherein the non laminated coating is formed by vacuum deposition.

8. The RF tag of claim 7, wherein the non laminated coating is parylene.

9. The RF tag of claim 1, wherein the non laminated coating is poly vinyl butyral.

10. The RF tag of claim 1, wherein the non laminated coating is nitro-cellulose.

11. The RF tag of claim 1, wherein the non laminated coating is a UV cured epoxy compound.

12. The RF tag of claim 1, wherein the non laminated coating is a high temperature cured epoxy compound.

13. The RF tag of claim 1, wherein the non laminated coating is a radiation cured compound.

* * * * *